US011145494B2

(12) United States Patent
Okita et al.

(10) Patent No.: US 11,145,494 B2
(45) Date of Patent: Oct. 12, 2021

(54) PLASMA PROCESSING APPARATUS

(71) Applicant: PANASONIC CORPORATION, Osaka (JP)

(72) Inventors: Shogo Okita, Hyogo (JP); Mitsuhiro Okune, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 971 days.

(21) Appl. No.: 14/471,431

(22) Filed: Aug. 28, 2014

(65) Prior Publication Data
US 2015/0059980 A1    Mar. 5, 2015

(30) Foreign Application Priority Data
Sep. 2, 2013 (JP) .............................. JP2013-181259

(51) Int. Cl.
 *H01J 37/32* (2006.01)
 *H01L 21/683* (2006.01)
(52) U.S. Cl.
 CPC .. *H01J 37/32477* (2013.01); *H01J 37/32495* (2013.01); *H01J 37/32522* (2013.01);
 (Continued)
(58) Field of Classification Search
 CPC ............. H01J 37/32541; H01L 21/683; H01L 21/6831; H01L 21/6833; H01L 21/6835; H01L 21/6836
 See application file for complete search history.

(56) References Cited

U.S. PATENT DOCUMENTS 6,036,878 A * 3/2000 Collins ................. H01J 37/321
 216/68
2005/0016684 A1   1/2005 Sun et al.
 (Continued)

FOREIGN PATENT DOCUMENTS

CN         1577765       2/2005
JP      2007294812 A  * 11/2007
 (Continued)

OTHER PUBLICATIONS

JP2007294812A Wada English Machine Translation retrieved from Espacenet on Sep. 6, 2018 (Year: 2007).*
 (Continued)

*Primary Examiner* — Rakesh K Dhingra
*Assistant Examiner* — Laureen Chan
(74) *Attorney, Agent, or Firm* — Wenderoth, Lind & Ponack, L.L.P.

(57) ABSTRACT

In plasma processing, damage on a cover is prevented while thermal effect on an annular frame is suppressed. Plasma processing is applied to a substrate held by a carrier including an annular frame and a holding sheet. There are provided a chamber having a decompressible internal space, a plasma source for generating plasma in the chamber, a stage that is provided in the chamber and places the carrier thereon, and a cover that is placed above the stage to cover the holding sheet and the frame, and has a window penetrating through the thickness of the cover. The cover is made of a material having a high thermal conductivity, and a front face exposed to plasma, at least on the side of the window of the cover, is covered with a protect part made of a material having a low reactivity with plasma.

18 Claims, 4 Drawing Sheets

(52) U.S. Cl.
CPC .. *H01J 37/32623* (2013.01); *H01J 37/32853* (2013.01); *H01L 21/6831* (2013.01)

(56) References Cited

U.S. PATENT DOCUMENTS

| | | | | |
|---|---|---|---|---|
| 2005/0150459 | A1* | 7/2005 | Shang | C23C 16/4581 |
| | | | | 118/723 R |
| 2007/0283884 | A1* | 12/2007 | Tiller | C23C 14/564 |
| | | | | 118/715 |
| 2010/0216313 | A1 | 8/2010 | Iwai | |
| 2011/0096461 | A1* | 4/2011 | Yoshikawa | H01L 21/6833 |
| | | | | 361/234 |
| 2011/0306214 | A1* | 12/2011 | Zin | H01L 21/76802 |
| | | | | 438/714 |
| 2012/0067845 | A1* | 3/2012 | Monden | H01J 37/32192 |
| | | | | 216/69 |
| 2012/0238073 | A1* | 9/2012 | Johnson | H01L 21/3065 |
| | | | | 438/464 |
| 2012/0305194 | A1* | 12/2012 | Hayashi | H01J 37/321 |
| | | | | 156/345.54 |
| 2012/0322239 | A1* | 12/2012 | Singh | H01L 21/78 |
| | | | | 438/462 |
| 2013/0118686 | A1* | 5/2013 | Carducci | H01J 37/32495 |
| | | | | 156/345.1 |
| 2013/0230974 | A1* | 9/2013 | Martinez | H01L 21/68771 |
| | | | | 438/464 |
| 2013/0244405 | A1* | 9/2013 | Terahara | H01J 37/321 |
| | | | | 438/466 |
| 2013/0295775 | A1 | 11/2013 | Iwai | |

FOREIGN PATENT DOCUMENTS

| | | | |
|---|---|---|---|
| JP | 2010-192488 | 9/2010 | |
| JP | 2011-124274 | 6/2011 | |
| JP | 4858395 | 1/2012 | |
| JP | 2012-248741 | 12/2012 | |
| JP | 2012248741 A | * 12/2012 | ............ H01J 37/321 |
| JP | 2014-513868 | 6/2014 | |
| WO | 2012/125560 A2 | 9/2012 | |
| WO | 2012/125560 A3 | 9/2012 | |
| WO | 2012/164857 | 12/2012 | |

OTHER PUBLICATIONS

Office Action dated Sep. 6, 2016 in Japanese Application No. 2013-181259.
First Office Action dated May 2, 2017 in corresponding Chinese Application No. 201410440345.9, with full English translation.
Office Action dated May 24, 2016 in Japanese Application No. 2013-181259.
First Office Action dated May 2, 2017 in corresponding Chinese Application No. 201410440345.9, with partial English translation.
The Second Office Action dated Dec. 19, 2017 in corresponding Chinese Application No. 201410440345.9, with partial English translation.

* cited by examiner

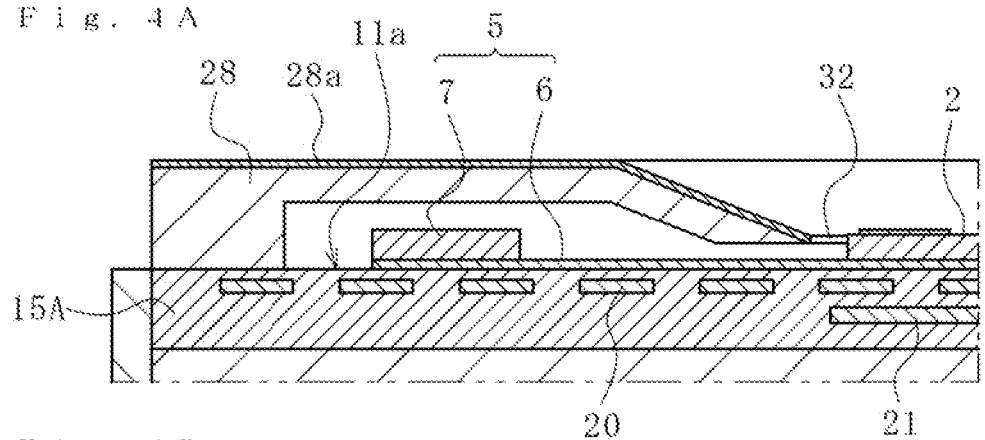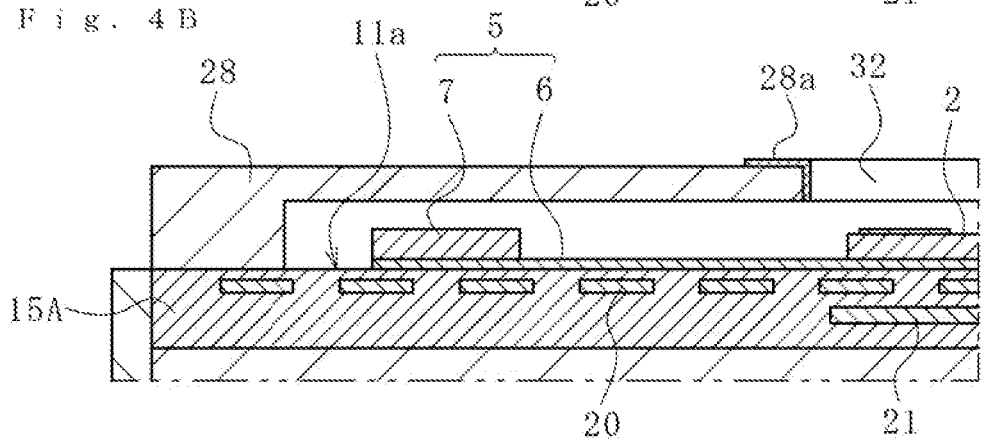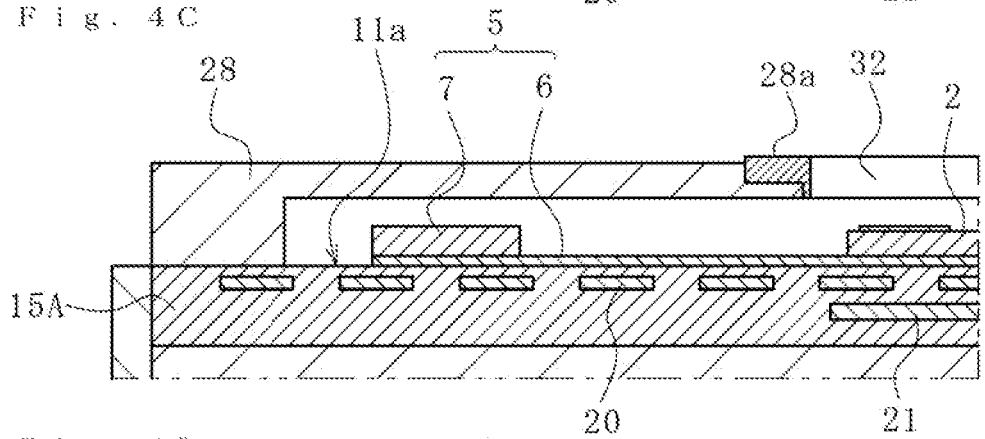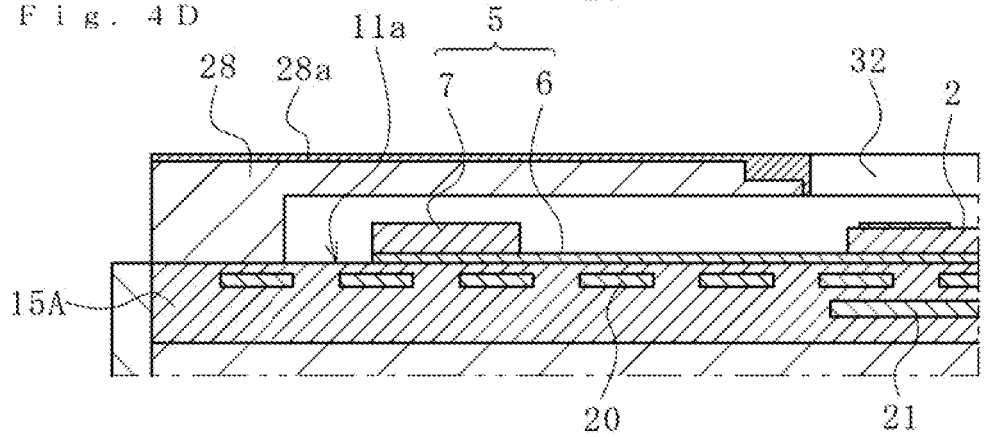

PLASMA PROCESSING APPARATUS

CROSS-REFERENCE TO RELATED APPLICATIONS

This application claims priority from Japanese Patent Application No. 2013-181259, the disclosures of which are incorporated herein by reference in their entireties.

BACKGROUND

1. Technical field

The present disclosure relates to a plasma processing apparatus, and in particular, a technique effective for plasma processing of a wafer held by a carrier configured of an annular frame and a holding sheet.

2. Description of Related Art

Known plasma processing apparatuses are disclosed in Japanese Patent No. 4858395 and in U.S. Patent Application Publication No. 2012/0238073. These plasma processing apparatuses function to apply processing to a wafer held by a carrier configured of an annular frame and a holding sheet. In applying plasma dicing to the wafer, a cover coats the annular frame so as not to expose the annular frame to plasma.

SUMMARY

In the conventional plasma processing apparatus, the cover made of a material having a good etching resistance, such as quartz and ceramics prevents the annular frame from being directly exposed to plasma. However, as a result of repeated etching, the cover accumulates heat therein and becomes hot, disadvantageously causing thermal damage to the holding sheet.

An aspect of the present disclosure provides a plasma processing apparatus configured to apply plasma processing to a substrate held by a carrier including an annular frame and a holding sheet, the plasma processing apparatus comprising:

a chamber having a decompressible internal space;

a plasma source configured to generate plasma in the chamber;

a stage provided in the chamber, the stage being configured to place the carrier thereon; and a cover placed on the stage, the cover being configured to cover the holding sheet and the frame, and have a window penetrating through a thickness of the cover, wherein the cover is made of a material having a high thermal conductivity, and a front face exposed to plasma, at least on the window side of the cover, is covered with a protect part made of a material having a low reactivity with plasma.

With such configuration, heat can be easily escaped via the cover having a high thermal conductivity, thereby reducing thermal effect on the carrier exposed to plasma, and preventing thermal damage on the protect sheet. Further, since the cover at least on the window side is made of a material having a low reactivity with plasma, the cover may be made of a material having a high thermal conductivity to improve durability.

Additional benefits and advantages of the disclosed embodiments will be apparent from description and Figures. The benefits and/or advantages may be individually provided by the various embodiments and features of the description and drawings disclosure, and need not all be provided in order to obtain one or more of the same.

According to the present disclosure, since the cover is made of the material having a high thermal conductivity, heat due to plasma can be easily escaped to reduce thermal effect on the carrier. This can prevent thermal damage on a protect sheet of the carrier. Further, even when plasma is densified, heat can be effectively escaped by means of the cover made of the material having a high thermal conductivity. Therefore, the etching rate can be increased to improve throughputs (the number of substrates treated per unit time). Moreover, a protect part can be formed on the cover at least on the window side, so that a highly durable cover is realized.

BRIEF DESCRIPTION OF THE DRAWINGS

FIGS. 4A to 4D are partial sectional views illustrating various examples of a protect part formed on a cover in FIG. 2.

DETAILED DESCRIPTION OF THE PREFERRED EMBODIMENT

Figure 1:
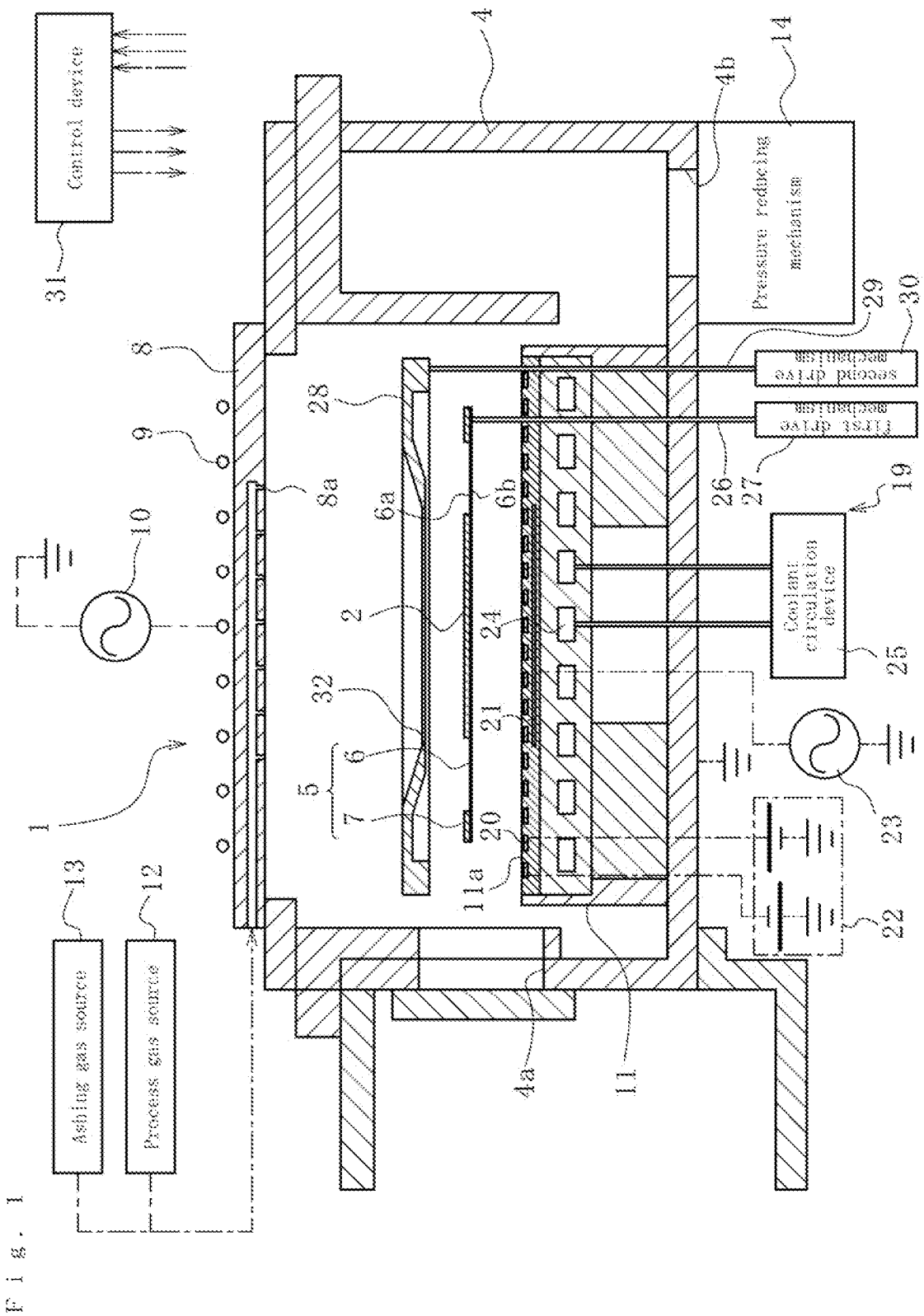
FIG. 1 is a front sectional view schematically illustrating a plasma processing apparatus in accordance with a present embodiment.

According to a first aspect of the present disclosure, there is provided a plasma processing apparatus configured to apply plasma processing to a substrate held by a carrier including an annular frame and a holding sheet, the plasma processing apparatus comprising:

a chamber having a decompressible internal space;

a plasma source configured to generate plasma in the chamber;

a stage provided in the chamber, the stage being configured to place the carrier thereon; and a cover placed on the stage, the cover being configured to cover the holding sheet and the frame, and have a window penetrating through a thickness of the cover, wherein the cover is made of a material having a high thermal conductivity, and a front face exposed to plasma, at least on the window side of the cover, is covered with a protect part made of a material having a low reactivity with plasma.

According to a second aspect of the present disclosure, there is provided a plasma processing apparatus according to the first aspect, wherein the protect part covers the entire front face of the cover exposed to plasma.

According to a third aspect of the present disclosure, there is provided a plasma processing apparatus according to the first aspect, wherein the cover is made of a metal material having a high thermal conductivity, and the protect part is made of one of quartz, alumina, aluminum nitride, aluminum fluoride, silicon carbide, and silicon nitride.

With such configuration, even when the cover is heated by plasma, since the cover is made of the material having a high thermal conductivity, and the lower face on the outer peripheral side is placed in contact with the stage, heat can be appropriately radiated via the stage. Further, the cover itself is protected with the protect part, thereby being prevented from scattering due to plasma applied to a part of the cover.

According to a fourth aspect of the present disclosure, there is provided a plasma processing apparatus according to the third aspect, wherein the protect part is formed by spraying.

According to a fifth aspect of the present disclosure, there is provided a plasma processing apparatus according to the first aspect, wherein the cover is made of a ceramic material having a high thermal conductivity, and the protect part is made of one of quartz, alumina, aluminum nitride, aluminum fluoride, silicon carbide, and silicon nitride, and is attached to the cover.

According to a sixth aspect of the present disclosure, there is provided a plasma processing apparatus according to the first aspect, wherein elevating/lowering means configured to elevate/lower the cover with respect to the stage is further provided, and the elevating/lowering means lowers the cover to bring a lower face of the cover into contact with an upper face of the stage.

According to a seventh aspect of the present disclosure, there is provided a plasma processing apparatus according to the first aspect, wherein elevating/lowering means configured to elevate/lower the stage with respect to the cover is further provided, the cover is attached inside of the chamber, and the elevating/lowering means brings an upper face of the stage into contact with a lower face of the cover.

With such configuration, heat of the cover heated by irradiation with plasma is radiated via the stage.

An embodiment of the present disclosure will be described below with reference to appended figures. In following description, terms indicating specific directions and positions (for example, terms including "upper", "lower", "side", and "end") are used as needed. However, these terms are used to facilitate understanding of the disclosure with reference to the figures, and their meanings do not limit the technical scope of the present disclosure. Further, the following description is essentially illustrative, and does not intend to limit the present disclosure, objects to which the present disclosure applies, or applications of the present disclosure.

Figure 2:
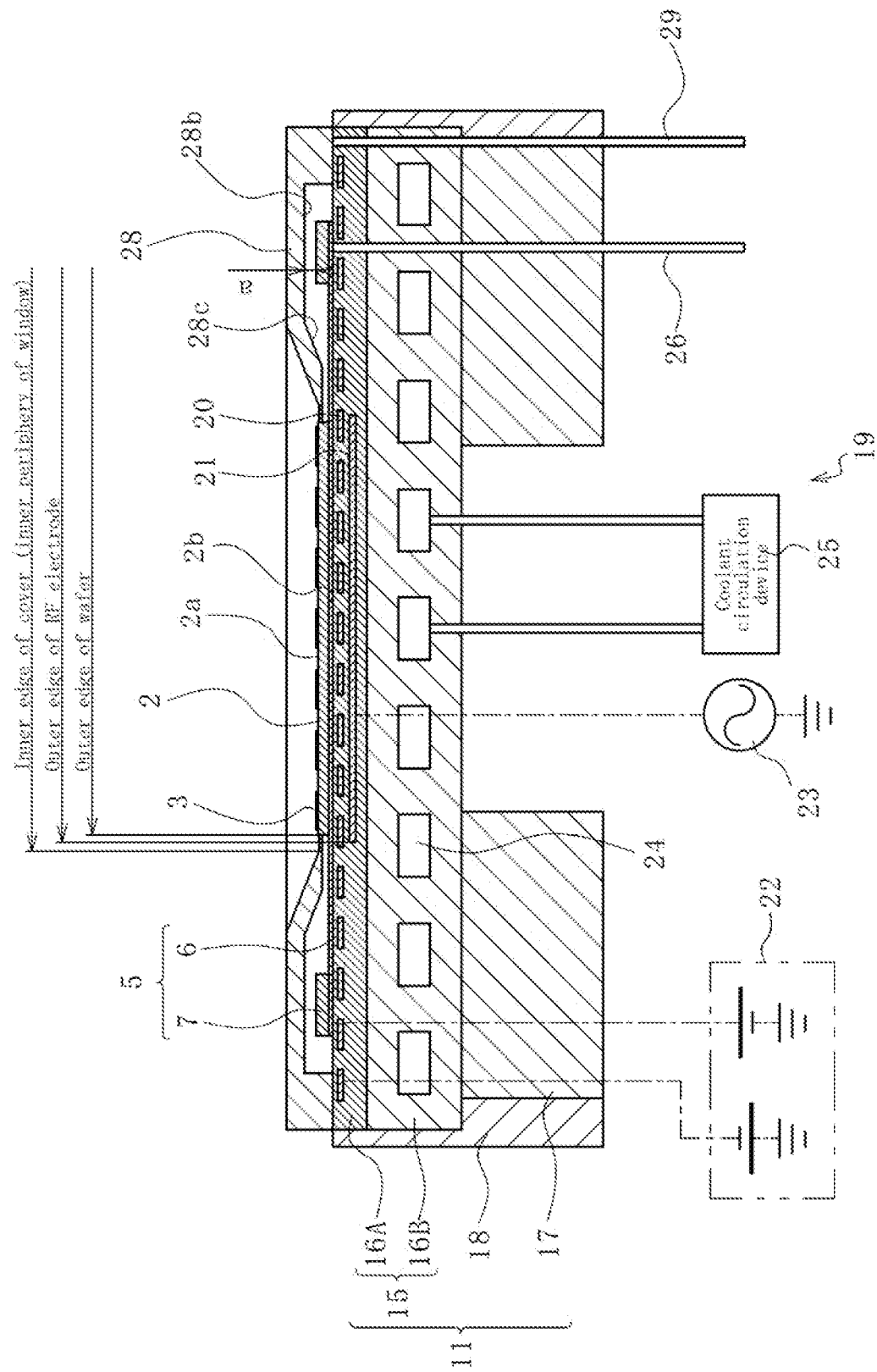
FIG. 2 is a partial enlarged view of FIG. 1.

FIG. 1 illustrates a dry etching apparatus 1 as an example of a plasma processing apparatus in accordance with an embodiment of the present disclosure. In the present embodiment, the dry etching apparatus 1 operates to apply plasma dicing and subsequent ashing to a wafer (substrate) 2. Plasma dicing is a method of cutting a wafer 2, on which a plurality of IC parts (semiconductor devices) are formed, along boundaries (streets) by dry etching to divide the wafer into the individual IC parts. Referring to FIG. 2, the circular wafer 2 in the present embodiment includes a front face 2a on which IC parts not shown and other components are formed and a back face 2b (on which the IC parts and other components are not formed) on the opposite side to the front face 2a. A mask 3 having a pattern for plasma dicing is formed on the upper face of the wafer 2.

The dry etching apparatus 1 includes a chamber 4 having a decompressive internal space. A carrier 5 can be stored in the internal space of the chamber 4 through a gate 4a. The carrier 5 includes a holding sheet 6 that detachably holds the wafer 2. An example of the holding sheet 6 is a so-called UV tape that can be elastically stretched and holds the wafer 2 by an adhesive force, but changes its chemical characteristics by application of an ultraviolet ray to greatly decrease the adhesive force. One face of the holding sheet is an adhesive face (adhesive face 6a), while the other face is a non-adhesive face (non-adhesive face 6b). The holding sheet 6 is flexible and thus, itself easily flexes to be incapable of keeping its uniform shape. For this reason, a substantially ring-like thin frame (annular frame) 7 is stuck to the adhesive face 6a near the outer edge of the holding sheet 6. The frame 7 is made of, for example, metal such as stainless steel and aluminum or resin, and has a rigidity that enables shape retention along with the holding sheet 6.

Figure 3:
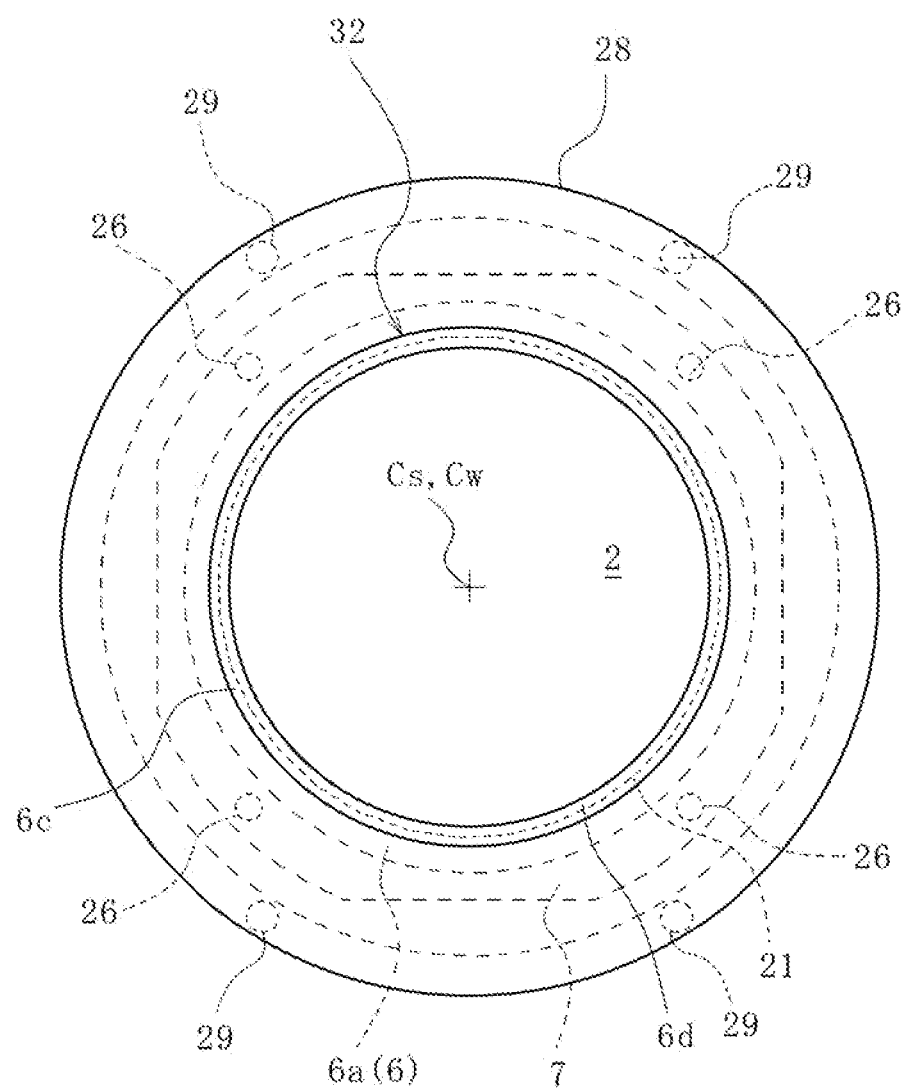
FIG. 3 is a plan view of FIG. 2.

By sticking the back face 2b to the adhesive face 6a, the holding sheet 6 of the carrier 5 holds the wafer 2. As shown in FIG. 3, the wafer 2 is disposed at the center of a circular area 6c surrounded with the frame 7 in the adhesive face 6a of the holding sheet 6. Specifically, the wafer 2 is positioned with respect to the holding sheet 6 such that a center Cs of the circular area 6c substantially matches a center Cw (the center of the wafer 2 when viewed from the front face 2a or the back face 2b) of the wafer 2. A wide annular area 6d having a constant width is formed between the wafer 2 held by the holding sheet 6 and the frame 7 by disposing the wafer 2 at the center of the circular area 6c. An outer edge of an RF electrode 21 is set to be located in the annular area 6d in a plan view.

As shown in FIG. 1, an antenna 9 (plasma source) as an upper electrode is disposed above a dielectric wall 8 that closes the top of a chamber 4 (vacuum container) of the dry etching apparatus 1. The antenna 9 is electrically connected to a first high frequency power source 10. A stage 11, on which the carrier 5 holding the wafer 2 as described above is placed, is placed on the bottom side of the chamber. A process gas source 12 and an ashing gas source 13 are connected to a gas inlet port 8a of the chamber 4, and a pressure reducing mechanism 14 including a vacuum pump for evacuating the chamber 4 is connected to an exhaust port 4b.

As shown in FIG. 2, the stage 11 includes an electrode unit 15 configured of an electrostatic chuck 16A and an electrode unit body 16B disposed under the electrostatic chuck 16A, a base 17 under the electrode unit body 16B, and an outer sheath 18 surrounding outer peripheries of these components. The stage 11 is provided with a cooling device 19.

The electrostatic chuck 16A of the electrode unit 15 is formed of a sheet (tape) made of a thin ceramic, a sprayed ceramic, or a dielectric material. The carrier 5 holding the wafer 2 is placed at the center of the upper face of the electrostatic chuck 16A. A below-mentioned cover 28 is placed on the outer periphery side of the electrostatic chuck 16A. In the present embodiment, a central portion of the electrostatic chuck 16A, that is, a portion of the upper face of the electrode unit 15, which is covered with the placed carrier 5, is a first region, and a portion extending outward from the first region is a second region that contacts the cover 28. The electrostatic chuck 16A includes a bipolar electrostatic attraction electrode 20 on its upper side, and the unipolar RF (high frequency) electrode 21 on its lower side therein. A DC power source 22 is electrically connected to the electrostatic attraction electrode 20. The electrostatic attraction electrode 20 is disposed over the first region and the second region, which extend from the center of the carrier 5 to a lower face on the outer peripheral side of the cover 28. This enables electrostatic adsorption of the frame 7 and the cover 28. A second high frequency power source 23 is electrically connected to the RF electrode 21. The outer edge of the RF electrode 21 is located closer to the outer periphery than the wafer 2 placed on the carrier 5, and on the inner peripheral side of the inner edge of the cover 28, in a plan view. Accordingly, the entire wafer 2 can be etched by generated plasma, and a sheath region does not cover the cover 28, reducing thermal damage.

The electrode unit body 16B of the electrode unit 15 is made of metal (for example, aluminum alloy). A coolant flow path 24 is formed in the electrode unit body 16B.

The cooling device 19 is configured of the coolant flow path 24 formed in the electrode unit body 16B and the coolant circulation device 25. The coolant circulation device 25 circulates a temperature-regulated coolant in the coolant flow path 24 to keep the electrode unit body 16B at a desired temperature. The cooling device 19 in the present embodiment can cool the first region and the second region of the stage 11, that is, both of the carrier 5 and the cover 28. This can miniaturize the plasma processing apparatus and simplify the configuration of the plasma processing apparatus.

The outer sheath 18 is made of an earth shield material (metal having conductivity and etching resistance). The outer sheath 18 protects the electrode unit 15, and the base 17 against plasma.

The carrier 5 is placed on the electrode unit 15 of the stage 11 with the face of the holding sheet 6 (adhesive face 6a), which holds the wafer 2 being faced upward, and the non-adhesive face 6b of the holding sheet 6 being in contact with the upper face of the electrode unit 15. The carrier 5 is placed at a predetermined position and an orientation (including a rotational angle about the center Cs of the circular area 6c of the holding sheet 6) with respect to the electrode unit 15 by using a conveying mechanism not shown. The predetermined position and orientation is hereinafter referred to as a normal position.

The carrier 5 placed at the normal position is raised and discharged by a first drive rod 26 after below-mentioned process. The first drive rod 26 is elevated and lowered by a first drive mechanism 27 conceptionally shown in only FIG. 1. Specifically, the carrier 5 can be moved to the elevated position in FIG. 1 and a lowered position in FIG. 2.

The cover 28 that is elevated and lowered on the upper side of the stage 11 is provided in the chamber 4. The cover 28 is formed by molding a metal material such as aluminum or aluminum alloy, or a ceramic material having a high thermal conductivity such as silicon carbide or aluminum nitride into a uniformly-thinned doughnut shape having a circular outer contour and a window 32 on the inner diameter side.

An outer diameter of the cover 28 is sufficiently larger than the outer contour of the carrier 5. This is made to cover the holding sheet 6 and the frame 7 of the carrier 5 during plasma processing for protection against plasma.

An inner diameter of the cover 28 is set to be ±2 mm of the outer diameter of the wafer 2. Although the inner diameter of the cover 28 is larger than the outer diameter of the wafer 2 in the example shown in FIG. 4, the inner diameter of the cover 28 may be made smaller than the outer diameter of the wafer 2 to cover the outer periphery of the wafer with the cover 28.

At lowering, the lower face of the cover 28 is brought into surface-contact with the upper face of the second region. This region is located on the outer peripheral side of the stage 11 to ensure a sufficient contact area. Accordingly, heat of the cover 28 can be easily escaped to the second region, thereby efficiently cooling the cover 28. Further, by bringing the lower face of the cover 28 into surface-contact with the upper face of the second region near the frame 7, thermal damage on the carrier 5 (sheet, frame, wafer) can be effectively prevented. Especially, heating of the frame that tends to become hot due to radiation heat can be suppressed to prevent thermal damage on the sheet in contact with the frame.

To enhance adhesion between the cover 28 and the second region, the lower face of the cover 28 or the upper face of the second region may be provided with elastic sheet or O-ring. This can further improve the cooling effect of the cover 28.

As shown in FIG. 4A, a protect part 28a made of a material having a low reactivity with plasma, such as quartz, alumina, aluminum nitride, aluminum fluoride, silicon carbide, or silicon nitride, is formed on the upper face of the cover 28. The material for the protect part 28a is different from the material for the cover 28, and may be selected based on the relation with used process gas. To enhance electrostatic adsorption (for example, by sticking a conductive sheet), a conductive layer may be formed on the lower face of the cover 28 (portion that contacts the electrode unit 15).

The protect part 28a is not necessarily formed on the entire upper face. For example, as shown in FIG. 4B, the protect part 28a may be formed on the inner peripheral face of the central hole (window 32) of the cover 28 and a portion communicating with the inner peripheral face. Alternatively, as shown in FIG. 4C, the inner periphery of the cover 28 may have a step, and the protect part 28a may be formed on the step, or as shown in FIG. 4D, may be also formed on the outer diameter side. However, it is preferable, by forming the protect part 28a on the entire upper face of the cover 28, to reliably prevent a part of the cover 28 from scattering due to irradiated plasma and adhering the wafer 2 disposed on the inner diameter side, that is, the occurrence of contamination. The protect part 28a can be formed on the cover 28 by spraying or assembling. When the material for the cover 28 is a metal material such as aluminum or aluminum alloy, the protect part 28a (coating layer) is formed by spraying or assembling. Examples of the material used for spraying include quartz, alumina, aluminum nitride, aluminum fluoride, silicon carbide, and silicon nitride. Examples of the material used for assembling include quartz, alumina, aluminum nitride, silicon carbide, and silicon nitride. In the case of assembling, the protect part 28a can be bonded to, fitted into, or fastened to the cover 28 made of a planar material. When the material for the cover 28 is a ceramic material such as silicon carbide or aluminum nitride, the protect part 28a is bonded to, fitted into, or fastened to the upper face of the cover 28 that is the (planar, annular, or block-like) member made of quartz, alumina, aluminum nitride, silicon carbide, or silicon nitride. When the protect part 28a is attached to the cover 28 by assembling, it is preferable to bring the protect part 28a into point-contact with the cover 28 rather than to bring the protect part 28a into surface-contact with the cover 28. Specifically, by forming irregularities or protrusions on, or roughening one or both of the protect part 28a and the cover 28, the contact area between the protect part 28a and the cover 28 can be reduced, suppressing heat transfer from the protect part 28a to the cover 28. This can prevent thermal damage on the carrier 5 more effectively.

An outer diameter of the RF electrode 21 is equal to or larger than the outer diameter of the wafer 2. As the outer diameter of the RF electrode 21 is larger, the etching rate advantageously becomes more uniform. However, when the outer diameter of the RF electrode 21 is too large, the generated plasma sheath region covers the cover 28, and ions hitting against the cover 28 increase to further heat the cover 28. Accordingly, properly designing the outer diameter of the RF electrode 21 is important for achieving a uniform etching rate and preventing overheating of the cover 28 (preventing the cover 28 from being excessively heated and having a high temperature). In the present embodiment, uniform etching and prevention of overheating of the cover 28 are achieved by setting the outer diameter of the wafer 2, the outer diameter of the RF electrode 21, and the inner diameter of the cover 28 in ascending order of size.

The cover 28 is elevated and lowered using the second drive rod 29. The second drive rod 29 is fixed to the cover 28 with a screw having a high thermal conductivity. When the cover 28 is heated, the heat is radiated via the second drive rod 29. The second drive rod 29 is elevated and lowered using a second drive mechanism 30 schematically shown only in FIG. 1. The second drive rod 29 is elevated/lowered, thereby elevating/lowering the cover 28. Specifically, the cover 28 can move to the elevated position shown in FIG. 1 and the lowered position shown in FIG. 2. At the lowered position, the lower face of the cover 28 contacts the upper face of the electrode unit 15 of the stage 11. In this manner, the second drive mechanism 30 functions as elevating/lowering means for elevating/lowering the cover 28 with respect to the stage 11, and also functions as attaching/detaching means for attaching/detaching the cover 28 to/from the placement plane 11a of the stage 11 (the upper face of the electrode unit 15).

As shown in FIG. 1, the cover 28 at the elevated position is located above the placement plane 11a of the stage 11 with a sufficient distance therebetween. Therefore, when the cover 28 is located at the elevated position, an operation of loading the carrier 5 (holding the wafer 2) on the upper face of the electrode unit 15 and an operation of unloading the carrier 5 from the upper face of the electrode unit 15 can be performed.

As shown in FIG. 2, the cover 28 of the lowered position covers the holding sheet 6 (except for the portion holding the wafer 2) and the frame 7 of the carrier 5 located at the normal position. The lower face of the cover 28 on the outer peripheral side contacts the upper face of the electrode unit 15, and is electrostatically absorbed by the electrostatic attraction electrode 20. In this state, heat of the cover 28 can be radiated from the electrode unit 15, the base 17, and the outer sheath 18 to the outside through the chamber 4.

In the state where the cover 28 covers the carrier 5, the ceiling plane 28b of the cover 28 is separated from the frame 7 with a sufficient gap a (for example, 5 mm) to prevent thermal effect during plasma processing. An inclined plane 28c of the cover 28 ensures a sufficient distance from the holding sheet 6 exposed on the inner diameter side of the frame 7. As apparent from the figure, the cover 28 at the lowered position does not contact any of the frame 7, the holding sheet 6, and the wafer 2.

A control device 31 schematically shown only in FIG. 1 controls the operation of each of components constituting the dry etching apparatus 1, which includes the first high frequency power source 10, the process gas source 12, the ashing gas source 13, the pressure reducing mechanism 14, the DC power source 22, second high frequency power source 23, the coolant circulation device 25, the first drive mechanism 27, and the second drive mechanism 30.

Next, the operation of the dry etching apparatus 1 in the present embodiment will be described.

First, the carrier 5 with the holding sheet 6 to which the wafer 2 is stuck at the center of the circular area 6c is conveyed into the chamber 4 using a conveying mechanism not shown, and is located at the normal position on the stage 11. At this time, the cover 28 is located at the elevated position (FIG. 1).

Then, the second drive mechanism 30 drives the second drive rod 29 to lower the cover 28 from the elevated position (FIG. 1) to the lowered position (FIG. 2). When the cover 28 is located at the lowered position, the holding sheet 6 and the frame 7 of the carrier 5 are covered with the cover 28, and the wafer 2 is exposed from the window 32. The cover 28 contacts the electrode unit 15 in the second region.

Subsequently, a DC voltage is applied from the DC power source 22 to the electrostatic attraction electrode 20 to hold the wafer 2 on the upper face of the electrode unit 15 of the stage 11 by electrostatic adsorption. Here, since the electrostatic attraction electrode 20 is disposed near the lower face of the cover 28, an adequate electrostatic force acts to stabilize the absorbed state.

Then, the chamber 4 is evacuated to be under a predetermined pressure using the pressure reducing mechanism 14 while process gas for plasma dicing is introduced thereinto from the process gas source 12. After that, high frequency power is supplied from the first high frequency power source 10 to the antenna 9, thereby generating plasma in the chamber 4 to irradiate the wafer 2 exposed from the window 32 of the cover 28 with plasma. At this time, a bias voltage is applied from the second high frequency power source 23 to the RF electrode 21 of the stage 11. The cooling device 19 cools the stage 11. The portion (street) of the wafer 2, which is exposed from the mask 3, is removed from the front face 2a to the back face 2b by a physicochemical action of radical and ions in plasma, and the wafer 2 is divided into individual chips.

In the above-mentioned plasma dicing, the cover 28 is exposed to plasma and heated and however, the cover 28 is made of a material having a high thermal conductivity. Thus, heat due to plasma can be discharged to the stage 11, preventing thermal damage on the carrier 5.

The protect part 28a having a low reactivity with plasma is formed on the upper face of the cover 28. For this reason, the front face of the cover 28 is protected against plasma and is not damaged. Thus, the problem that a part of the material for the cover 28 scatters and adheres to the wafer 2 on the carrier 5 in the window never occurs, eliminating contamination.

After the completion of plasma dicing, ashing is performed. The chamber 4 is evacuated to be under a predetermined pressure using the pressure reducing mechanism 14 while process gas for ashing (for example, oxygen gas) is introduced thereinto from the ashing gas source 13. Then, high frequency power is supplied from the first high frequency power source 10 to the antenna 9, thereby generating plasma in the chamber 4 to irradiate the wafer 2 exposed from the window 32 of the cover 28 with plasma. The mask 3 is completely removed from the front face 2a of the wafer 2 by irradiation with plasma.

Following ashing, the second drive rod 29 is driven by the second drive mechanism 30 to move the cover 28 from the lowered position to the elevated position. After that, the first drive rod 26 is driven by the first drive mechanism 27 to move the carrier 5 from the lowered position to the elevated position, and the carrier 5 is conveyed to the outside of the chamber using a conveying mechanism not shown.

The present disclosure is not limited to the configuration described in the embodiment, and may be variously modified.

For example, although the second drive mechanism 30 (elevating/lowering means or attaching/detaching means) causes the cover 28 to be elevated/lowered with respect to the stage 11 via the second drive rod 29 in the embodiment, the elevating/lowering means or the attaching/detaching means may be configured to elevate and lower the stage 11 with respect to the cover 28 fixed in the chamber 4. Even in this case, since the cover 28 is made of a material having a high thermal conductivity, heat of the cover 28 exposed to plasma can be radiated through the chamber 4. Therefore, as in the embodiment, the problem that the cover 28 becomes hot to indirectly heat the carrier 5 can be prevented.

The electrostatic attraction electrode 20 is not limited to be bipolar as in the embodiment, and may be unipolar.

Although the cover 28 is electrostatically adsorbed in the present embodiment, electrostatic adsorption of the cover 28 is not essential, and the electrostatic attraction electrode 20 may be located in at least the first region.

Treatment performed in the dry etching apparatus 1 is not limited to plasma dicing and ashing, and may be general dry etching, for example. The dry etching apparatus 1 is not limited to an ICP type as in the embodiment, and may be a parallel plate type.

What is claimed is:

1. A plasma processing apparatus configured to apply plasma processing to a substrate held by a carrier including a frame and a holding sheet, the plasma processing apparatus comprising:
   a chamber having a decompressible internal space;
   a plasma source configured to generate plasma in the chamber;
   a stage provided in the chamber, the stage being configured to place the carrier thereon, provided with a coolant flow path which is connected to a coolant circulator, a RF electrode which is electrically connected only to a high frequency power source, and an electrostatic attraction electrode which is electrically connected only to a DC power source, wherein the RF electrode is a single electrode; and
   a cover configured to cover the holding sheet and the frame, and to have a window penetrating through the thickness of the cover, wherein
   the cover is covered with a protect part,
   in a plan view, an outer diameter of the RF electrode is set so as to be disposed only inside of the window of the cover and the electrostatic attraction electrode is disposed both inside and outside of the window of the cover, and
   in the plan view, the protect part does not overlap the RF electrode.

2. A plasma processing apparatus configured to apply plasma processing to a substrate held by a carrier including a frame and a holding sheet, the plasma processing apparatus comprising:
   a chamber having a decompressible internal space;
   a plasma source configured to generate plasma in the chamber;
   a stage provided in the chamber, the stage being configured to place the carrier thereon, provided with a coolant flow path which is connected to a coolant circulator and a RF electrode which is electrically connected only to a high frequency power source, and an electrostatic attraction electrode which is electrically connected only to a DC power source, wherein the RF electrode is a single electrode; and
   a cover being configured to cover the holding sheet and the frame, and to have a window penetrating through the thickness of the cover, wherein
   the cover is covered with a protect part fixedly attached to the cover,
   a contact area between the protect part and the cover is reduced by forming irregularities or protrusions on, or roughening one or both of the protect part and the cover, and
   in a plan view, an outer diameter of the RF electrode is set so as to be disposed only inside of the window of the cover and the electrostatic attraction electrode is disposed both inside and outside of the window of the cover, and
   in the plan view, the protect part does not overlap the RF electrode.

3. A plasma processing apparatus configured to apply plasma processing to a substrate held by a carrier including a frame and a holding sheet, the plasma processing apparatus comprising:
   a chamber having a decompressible internal space;
   a plasma source configured to generate plasma in the chamber;
   a stage provided in the chamber, the stage being configured to place the carrier thereon, provided with a coolant flow path which is connected to a coolant circulator and a RF electrode which is electrically connected only to a high frequency power source, and an electrostatic attraction electrode which is electrically connected only to a DC power source, wherein the RF electrode is a single electrode; and
   a cover configured to cover the holding sheet and the frame, and to have a window penetrating through the thickness of the cover, wherein
   in a plan view, an outer diameter of the RF electrode is set so as to be disposed only inside of the window of the cover and the electrostatic attraction electrode is disposed both inside and outside of the window of the cover.

4. The plasma processing apparatus according to claim 1, wherein
   the stage has an upper face including a first region which is covered with the placed carrier and a second region which extends outward from the first region,
   the plasma processing apparatus is configured to change the distance between the cover and the stage to bring a lower face of the cover into contact with the second region of the upper face of the stage,
   the cover is made of a metal material or a ceramic material having a high thermal conductivity selected from the group consisting of silicon carbide and aluminum nitride, and
   an upper face of the cover and at least an inner peripheral surface of the window of the cover is covered with the protect part made of a material having a low reactivity with plasma selected from the group consisting of quartz, alumina, aluminum nitride, aluminum fluoride, silicon carbide, and silicon nitride.

5. The plasma processing apparatus according to claim 4, wherein the protect part covers the entire upper face of the cover and the inner peripheral surface of the window of the cover that is exposed to plasma.

6. The plasma processing apparatus according to claim 4, wherein the protect part is attached to the cover.

7. The plasma processing apparatus according to claim 4, further comprising a drive rod fixed to the cover such that the drive rod moves the cover to bring a lower face of the cover into contact with the second region of the upper face of the stage.

8. The plasma processing apparatus according to claim 4, wherein
   the cover is attached inside of the chamber, and
   the stage is configured to move to bring the second region of the upper face of the stage into contact with an outer peripheral side of a lower face of the cover.

9. The plasma processing apparatus according to claim 8, wherein the stage has an upper face including a first region which is covered with the placed carrier and a second region which extends outward from the first region, the plasma processing apparatus is configured to change the distance between the cover and the stage to bring a lower face of the cover into contact with the second region of the upper face of the stage.

10. The plasma processing apparatus according to claim 9, wherein the protect part is attached to the cover by assembling.

11. The plasma processing apparatus according to claim 9, wherein a material for the protect part is quartz, alumina, aluminum nitride, silicon carbide, or silicon nitride.

12. The plasma processing apparatus according to claim 3, wherein the stage has an upper face including a first region which is covered with the placed carrier and a second region which extends outward from the first region, the plasma processing apparatus is configured to change the distance between the cover and the stage to bring a lower face of the cover into contact with the upper face of the stage outside of the frame placed on the stage, the cover is made of a material having a high thermal conductivity, and an upper face of the cover and at least an inner peripheral surface of the window of the cover is covered with a protect part made of a material having a low reactivity with plasma.

13. The plasma processing apparatus according to claim 12, wherein the protect part covers the entire upper face of the cover and the inner peripheral surface of the window of the cover that is exposed to plasma.

14. The plasma processing apparatus according to claim 12, wherein the cover is made of a metal material, and the protect part is made of one of quartz, alumina, aluminum nitride, aluminum fluoride, silicon carbide, or silicon nitride.

15. The plasma processing apparatus according to claim 12, wherein the cover is made of a ceramic material selected from the group consisting of silicon carbide and aluminum nitride, and the protect part is made of one of quartz, alumina, aluminum nitride, aluminum fluoride, silicon carbide, or silicon nitride.

16. The plasma processing apparatus according to claim 1, wherein the outer diameter of the RF electrode is equal to or larger than an outer diameter of the substrate.

17. The plasma processing apparatus according to claim 2, wherein the outer diameter of the RF electrode is equal to or larger than an outer diameter of the substrate.

18. The plasma processing apparatus according to claim 3, wherein the outer diameter of the RF electrode is equal to or larger than an outer diameter of the substrate.

\* \* \* \* \*